United States Patent [19]

Bruhnke et al.

[11] Patent Number: 5,449,894
[45] Date of Patent: Sep. 12, 1995

[54] IC CARD HAVING A VOLTAGE DETECTOR FOR DETECTING BLANKING GAPS IN AN ENERGY-TRANSMITTING ALTERNATING FIELD

[75] Inventors: Michael Bruhnke, Munich; Klötzig, Eching; Klaus Klosa; Stuart Smith, both of Munich, all of Germany

[73] Assignee: Temic Telefunken microelectronic GmbH, Heilbronn, Germany

[21] Appl. No.: 153,915

[22] Filed: Nov. 17, 1993

[30] Foreign Application Priority Data

Dec. 18, 1992 [DE] Germany .................. 42 43 108.5

[51] Int. Cl.⁶ .................. G06K 19/06; G06K 19/00
[52] U.S. Cl. .................. 235/492; 235/487
[58] Field of Search ............... 235/449, 492, 487, 491

[56] References Cited

U.S. PATENT DOCUMENTS 5,274,220 12/1993 Fukuoka .................. 235/487
5,286,955 2/1994 Klosa .................. 235/380

FOREIGN PATENT DOCUMENTS

0289136A2  3/1988  European Pat. Off. .
0309201A2  9/1988  European Pat. Off. .
0369622A2  10/1989 European Pat. Off. .
0473569A2  8/1991  European Pat. Off. .
2748584C3  5/1978  Germany .
4100693A1  7/1991  Germany .
4003410A1  8/1991  Germany .
4107311A1  9/1992  Germany .
4109114A1  9/1992  Germany .

OTHER PUBLICATIONS

Winfried Wigand "Die Karte mit dem Chip", Siemens Nixdorf Informationssysteme AG, Berlin and Munich, 1991, pp. 34–36.

Primary Examiner—Donald Hajec
Assistant Examiner—Karl D. Frech
Attorney, Agent, or Firm—Spencer, Frank & Schneider

[57] ABSTRACT

The invention relates to a method for operating a contactless and batteryless chip card. The chip card is supplied with energy via an alternating field by a write/-read unit. The bidirectional data transfer is achieved by modulation of the energy-transmitting alternating field. The chip card includes, inter alia, an antenna coil for receiving the alternating field, an input circuit generating the supply voltage from the coil current, and a voltage detector for detecting blanking gaps in the alternating field. By the method in accordance with the invention the voltage detector compares the two voltages at the coil ends with one another and then supplies an output signal, provided both the voltages are substantially equal in size for longer than a predetermined period. Furthermore, a chip card is described that contains a voltage detector permitting operation according to the method described.

6 Claims, 2 Drawing Sheets

IC CARD HAVING A VOLTAGE DETECTOR FOR DETECTING BLANKING GAPS IN AN ENERGY-TRANSMITTING ALTERNATING FIELD

BACKGROUND OF THE INVENTION

The invention relates to a method for operating a contactless and batteryless chip card in accordance with the preamble of claim 1. Furthermore, the invention relates to an array for implementation of the method.

Contactless and batteryless chip cards are known from, for example, Winfried Wigand "Die Karte mit dem Chip", Siemens Nixdorf Informationssysteme AG, Berlin and Munich, 1991, pages 34–36. The energy is supplied by transformer connection via an alternating field with a write/read unit. The alternating field is generated by this write/read unit. Data transmission from and to the chip card is achieved by modulation of this alternating field. A suitable method is described in DE 41 07 311 A1. On the chip card, modulation of the alternating field is effected during reading access by a connected load that damps the antenna coil. Amplitude modulation is used as the modulation type, and can be combined with other modulation methods.

The chip card known from the aforementioned patent application contains a voltage detector for detection of blanking gaps in the alternating field. The voltage detector is supplied with the voltage generated by the antenna coil. The precise function of the voltage detector is not described there. Generally speaking, however, a circuit array, for example amplifier and comparator, is necessary to process the analog signal in order to generate the required output signal.

The known arrays do however have the drawback that a large amount of circuitry is necessary for the voltage detector to operate dependably even at supply voltages of around 1 volt.

SUMMARY OF THE INVENTION

The object underlying the invention is to develop a method for operating a chip card in accordance with the preamble of claim 1 such that dependable recognition of the blanking gap is ensured even with the lowest supply voltages. This object is attained by a method having the features of claim 1. A further object of the invention is to provide a chip card for implementation of the above method. This object is attained by a chip card having the features of claim 3.

The advantageous development of the invention is achieved with the features in the sub-claims.

A contactless and batteryless chip card, on which the invention is based, is supplied with energy by an alternating field generated by an external write/read unit. Data transmission from and to the chip card is achieved by modulation of the energy-transmitting alternating field. The chip card 1 has an antenna coil 2 for connection to the alternating field. An input circuit 3 generates from the coil current the supply voltage VSS-VDD of the chip card 1. Furthermore, the chip card 1 has a voltage detector 4 for recognition of blanking gaps in the energy-transmitting alternating field. By the method in accordance with the invention, the voltage detector 4 compares the voltages at the two coil ends SP1, SP2 with one another and then supplies an output signal RF₁₃OK, provided both voltages are of approximately equal size for longer than a certain period, e.g., for a time period that is longer than that of a zero crossing of the coil voltage.

By direct comparison of the two voltages with one another, level adjustment of comparative voltages to various reception field strengths becomes superfluous.

An advantageous embodiment of the method provides for constant damping of the antenna coil 2 during the write mode, i.e. while data are being written on the chip card via field blanking of the alternating field. Constant damping of the antenna coil 2 leads to an energy loss via the damping resistor and has therefore always been avoided in the write mode in the case of chip cards to the prior art. In the method in accordance with the invention, damping of the antenna coil leads to a rapid drop in the coil energy in blanking gaps, with the two connections of the antenna coil SP1, SP2 quickly reverting to a common potential.

To permit definition of this potential too, a coil connection must be connected to a fixed reference level. This can be achieved using a high-value resistor R that draws the signal at one coil end to VDD in the field gaps. The resistor R is therefore connected on the one hand to the antenna coil 2 and on the other hand to the VDD potential of the supply voltage. The resistor R can furthermore be formed by a transistor.

An advantageous embodiment of the voltage detector 4 comprises a logic gate 7, whose two inputs are each connected to an end of the antenna coil 2 and whose output indicates whether there is a blanking gap in the alternating field.

To obtain a longer integration time, the output of the logic gate 7 is connected via a capacitor 8 to a potential of the supply voltage VSS-VDD.

The logic gate 7 is preferably a NOR gate 7c, in front of whose two inputs an inverter, 7a, 7b respectively is connected for clean conversion of the coil voltages SP1, SP2 into logic levels.

The output of the voltage detector 4 is formed by an inverter 9 that converts the integrated voltage collecting at the capacitor 8 into a binary output signal RF₁₃OK.

A resistor is provided for constant damping of the antenna coil 2 and connects one of the two connections SP1, SP2 of the antenna coil to a reference potential of the supply voltage VSS-VDD.

DESCRIPTION OF THE PREFERRED EMBODIMENTS

An embodiment of the invention is described in detail in the following on the basis of the figures.

Figure 1:
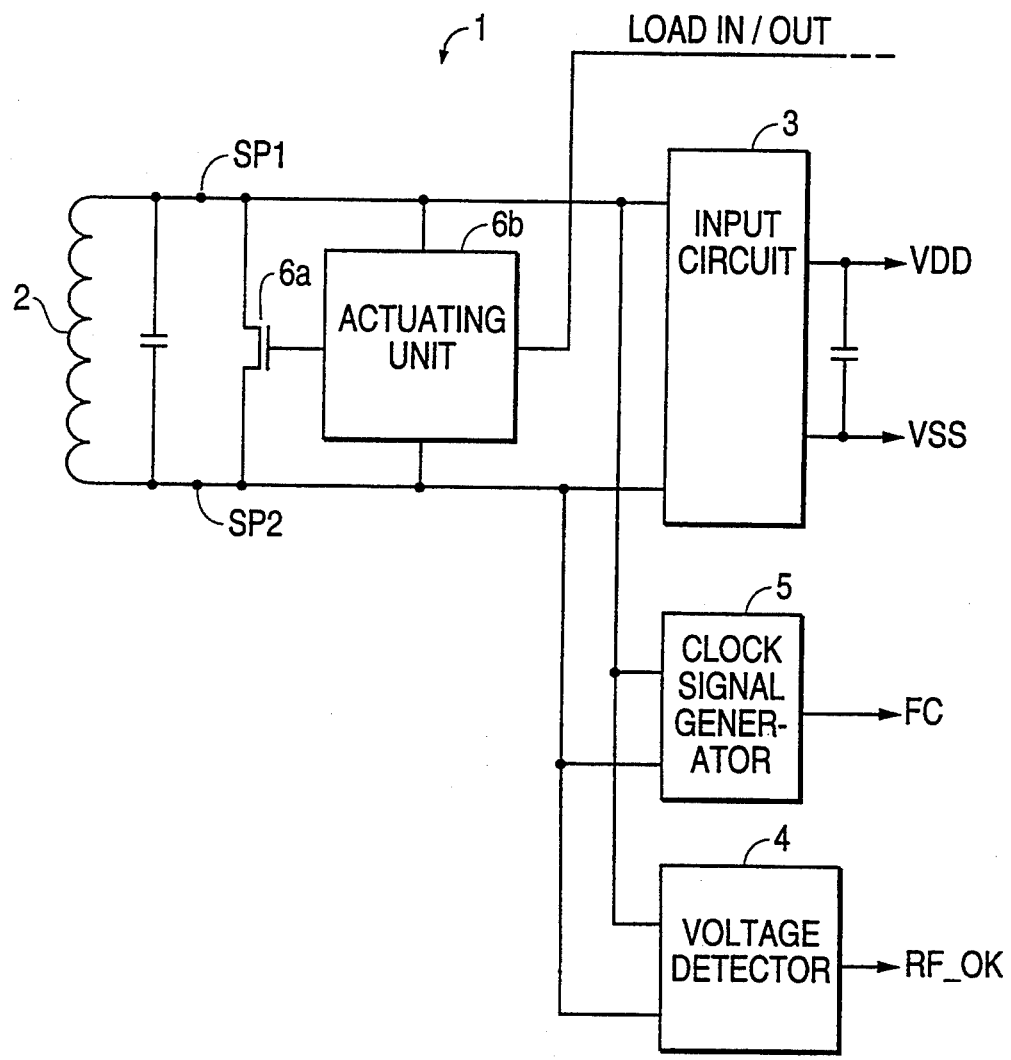
FIG. 1 shows a block diagram of the chip card in accordance with the invention.

The chip card 1 in FIG. 1 is supplied with energy and data by transformer connection to a write/read unit, not shown in the figure, via an alternating field generated by said unit. To receive the energy and the data, the chip card has an antenna coil 2. For a number of reasons the latter is not integrated into the semiconductor chip proper of the card, but instead disposed inside the card body. The antenna coil 2 is connected to the input circuit 3 of the chip card 1. The input circuit 3 obtains from the current of the antenna coil 2 the supply voltage VSS-VDD for the chip card 1. Furthermore, the data transmitted via the alternating field are prepared by the input circuit 3 for subsequent further processing. The further circuit components of the chip card IC, such as EEPROM, memory and data management, read-out circuits etc., are not shown in the figure for the sake of clarity.

The antenna coil 2 is furthermore connected to the voltage detector 4 and the clock signal generating circuit 5. The field effect transistor 6a ensures together with its actuating unit 6b damping of the antenna coil 2 in the read mode of the chip card. In the write mode, blanking gaps in the alternating field, on the basis of which the data are conveyed from the write/read unit to the chip card, are detected by the voltage detector 4. At its output, it supplies the signal $RF_{13}$ OK, provided the voltages at the two coil connections SP1, SP2 are of approximately equal size for longer than a certain period, e.g., for a time period that is longer than that of a zero crossing of the coil voltage. This case can however only occur when the two coil connections SP1, SP2 are short-circuited via the coil in a blanking gap of the alternating field. For a short time, the voltages are approximately equal in size even at zero crossover of the coil voltage. This condition is however ignored by the voltage detector 4.

Figure 2:
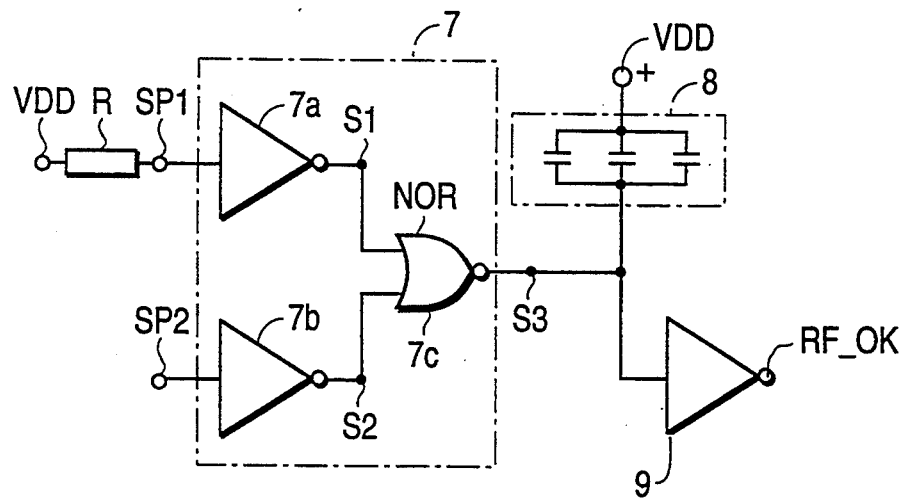
FIG. 2 shows an embodiment of the voltage detector.

FIG. 2 shows the design of the voltage detector 4. It comprises a NOR gate 7c with inverters 7a, 7b connected in front of the inputs S1, S2. At the output S3 of the NOR gate 7c a capacitor 8 ensures summing up of the output signal over a certain period. The time constant can be set using the size of the capacitor 8. This is indicated in the FIG. 2 by a parallel connection of three capacitors 8.

Figure 3:
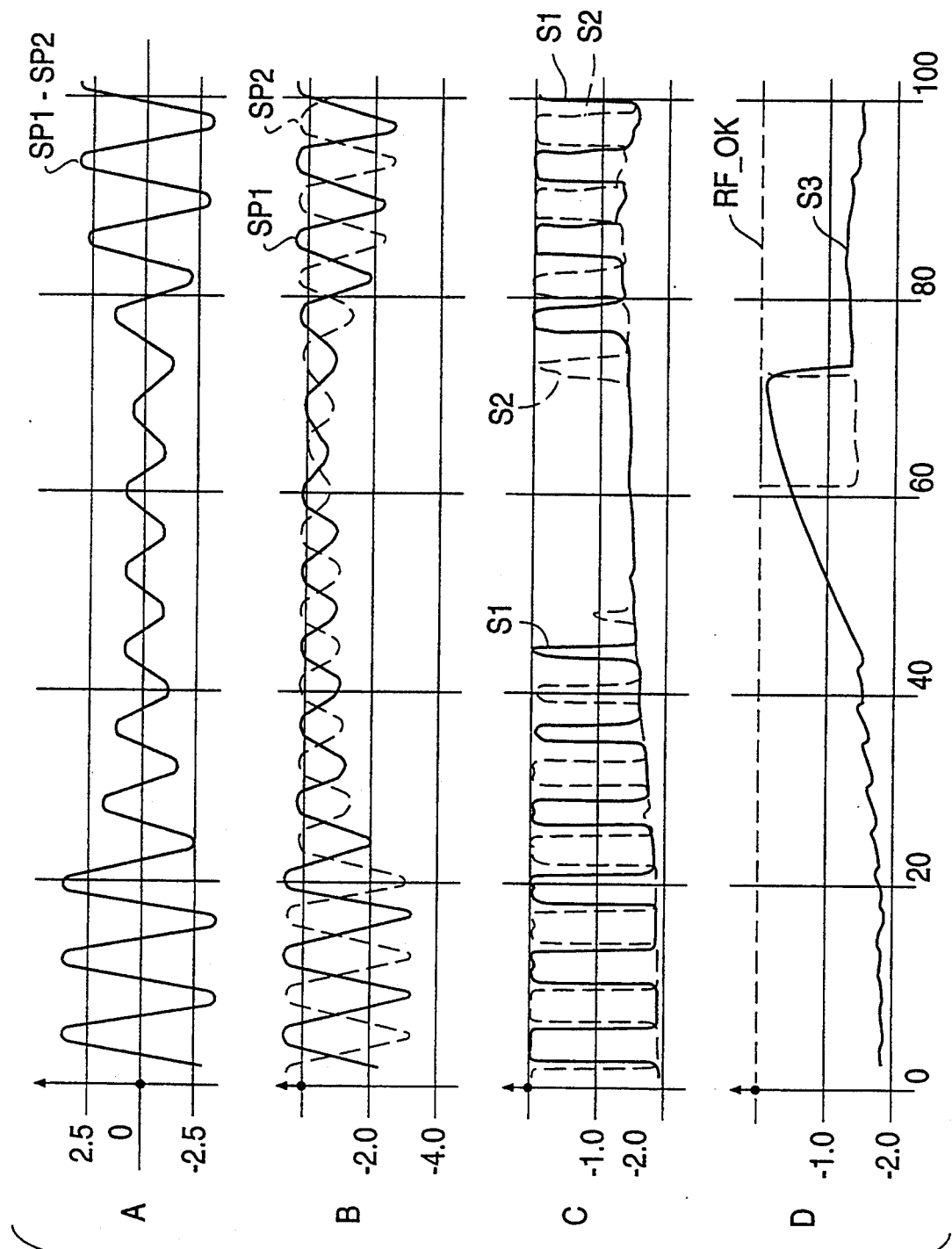
FIG. 3 shows the signal curve during field blanking.

FIG. 3 A-D reproduces the signal curve at various switching points of the voltage detector 4 in accordance with FIG. 2. The curve shown in graph A corresponds to the voltage measured between the coil connections SP1, SP2. On the horizontal axis, the time in microseconds is plotted. From the time mark 20 μs to the time mark 70 μs, there is a blanking gap in the alternating field. In this period, the amplitude of the coil voltage SP1-SP2 decreases continuously, since no more energy is being supplied from the outside. The amplitude of the coil voltage SP1-SP2 slowly dies out., After the end of the blanking gap, the amplitude increases until it is back at its original value.

Graph B shows in the same time frame the voltage curves at the two connections of the antenna coil SP1, SP2 measured across the reference potential VDD of the supply voltage VSS-VDD of the chip card. The amplitudes of the two voltages decrease within the blanking gap in the alternating field. Graph C shows the signal curve at the inputs S1, S2 of the logic gate 7c. The inverters 7a, 7b connected in front of the gate 7c act as threshold value switches, which do not actuate the following gate until the signal at the input has passed a threshold value. This corresponds to a conversion of an analog signal to a binary one.

Graph D shows the signal at the output S3 of the logic gate 7. The capacitor 8 connected to the output effects a time integration of the signal. The capacitor 8 is not sufficiently charged for switching through the following inverter 9 until the output signal has been emitted uninterrupted for a sufficiently long period. Graph D also shows the output signal of the voltage detector $RF_{13}$ OK. The inverter 9 acts as a threshold value switch that generates the logic signal $RF_{13}$ OK from the analog signal curve at the capacitors (signal to S3).

If there is now a blanking gap in the alternating field, the voltages at the coil ends SP1, SP2 fall in relation to the reference potential of the supply voltage VSS-VDD. The two inverters 7a, 7b at the inputs of the NOR gate 7c act as threshold value switches that digitize the analog signal supplied to them and convert it into a logical binary signal. The following NOR gate 7c links the two output signals S1, S2 of the inverters 7a, 7b. The capacitor 8 connected to the output of the NOR gate 7c effects a time integration. When the coil connections SP1, SP2 are of approximately equal size for a sufficiently long period, the voltage at the capacitor 8 rises so steeply that the inverter 9 also connected to the output of the NOR gate also switches over.

At the end of the blanking gap of the alternating field, the voltage at the connections of the antenna coil SP1, SP2 increases again and the voltage detector 4 is reset.

Suitable dimensioning of the gate 7c means that the time-lag is only effective at the start of the blanking gap. At the end, by contrast, the inverter 9 and hence the output signal $RF_{13}$ OK of the voltage detector 4 is switched over without a time-lag.

The voltage detector described, which can be constructed by simple circuitry measures, permits dependable operation of the chip card. The use of standard logic elements for processing of an analog signal means that operation of the voltage detector is possible without difficulty in the lower supply voltage ranges.

What is claimed is:

1. A method for operating a contactless and batteryless chip card which is supplied with energy via an energy-transmitting alternating field from a write/read unit, where a bidirectional data transfer is achieved by modulation of said energy-transmitting alternating field, having an antenna coil, the energy-transmitting field producing a coil current in the coil and a coil voltage across the coil, an input circuit coupled to ends of the coil for generating a supply voltage from the current in the coil, and a voltage detector coupled to the ends of the coil for detecting blanking gaps in said energy-transmitting alternating field wherein said voltage detector compares voltages at the ends of the coil and supplies an output signal, provided both said voltages at the ends of the coils are substantially equal for longer than a predetermined time period which time period is longer than that of a zero crossover time of the coil voltage.

2. A method according to claim 1, wherein said antenna coil is constantly damped during a write mode.

3. A contactless and batteryless chip card, which is supplied with energy via an energy-transmitting alternating field from a write/read unit, where a bidirectional data transfer is achieved by modulation of said energy-transmitting alternating field, having an antenna coil, the energy-transmitting field producing a coil current in the coil and a coil voltage across the coil, an input circuit coupled to ends of the coil for generating a supply voltage from the current in the coil, and a voltage detector coupled to the ends of the coil for detecting blanking gaps in said energy-transmitting alternating field, wherein said voltage detector comprises a logic gate having inputs connected to the ends of the coil and producing an output signal indicating whether there is a blanking gap in said energy-transmitting alternating field.

4. A chip card according to claim 3, further comprising a capacitor for connecting the output signal of said logic gate to a potential of the supply voltage and effecting a time-lag of said output signal of said logic gate.

5. A chip card according to claim 4, further comprising a circuit for connecting one end of said antenna coil to a defined voltage potential.

6. A chip according to claim 3, further comprising a circuit for connecting one end of said antenna coil to a defined voltage potential.

* * * * *